(12) United States Patent
Schwent et al.

(10) Patent No.: US 8,818,305 B1
(45) Date of Patent: Aug. 26, 2014

(54) SUPPLY TRANSITIONS IN AN ENVELOPE TRACKED POWER AMPLIFIER

(71) Applicant: Motorola Mobility LLC, Libertyville, IL (US)

(72) Inventors: Dale G. Schwent, Schaumburg, IL (US); Gregory R. Black, Vernon Hills, IL (US); Ryan J. Goedken, Lake Zurich, IL (US); Armin W. Klomsdorf, Chicago, IL (US)

(73) Assignee: Motorola Mobility LLC, Libertyville, IL (US)

( * ) Notice: Subject to any disclaimer, the term of this patent is extended or adjusted under 35 U.S.C. 154(b) by 0 days.

(21) Appl. No.: 13/676,513

(22) Filed: Nov. 14, 2012

(51) Int. Cl.
*H01Q 11/12* (2006.01)
*H04B 1/04* (2006.01)
*H03G 3/20* (2006.01)

(52) U.S. Cl.
USPC ............... 455/127.5; 455/115.3; 455/574; 330/127

(58) Field of Classification Search
USPC .......... 455/67.11, 115.1, 115.3, 127.1, 127.5, 455/574; 330/127
See application file for complete search history.

(56) References Cited

U.S. PATENT DOCUMENTS

| 7,038,536 B2 * | 5/2006 | Cioffi et al. | 330/127 |
| 8,190,926 B2 * | 5/2012 | Vinayak et al. | 455/572 |
| 8,405,456 B2 * | 3/2013 | Drogi et al. | 330/127 |

FOREIGN PATENT DOCUMENTS

WO  2011115533 A1  9/2011

* cited by examiner

*Primary Examiner* — Quochien B Vuong

(57) ABSTRACT

A method and system controls a transition between utilizing an envelope tracking (ET) mechanism and using an average power tracking (APT) mechanism to provide power to a power amplifier. A power amplifier controller (PAC) initiates an ET mechanism to track changes in amplitudes of a radio frequency (RF) signal being received by the power amplifier. If the PAC determines that the RF signal bandwidth is low and the average amplitude is at least equal to a threshold value, the PAC maintains the ET mechanism. If the RF signal bandwidth is high and/or the average amplitude of the RF signal is less than the threshold value, the PAC temporarily deactivates the ET mechanism and controls a transition to utilizing the APT mechanism by properly synchronizing the transition to the change in average signal amplitude levels so there are no undesired transients affecting signal quality or spectrum.

20 Claims, 8 Drawing Sheets

SUPPLY TRANSITIONS IN AN ENVELOPE TRACKED POWER AMPLIFIER

BACKGROUND

1. Technical Field

The present disclosure relates in general to wireless communication devices and in particular to power amplifiers in wireless communication devices.

2. Description of the Related Art

Envelope Tracking (ET) power amplifiers deliver higher efficiency at equal spectral performance to conventional power amplifiers. The efficiency improvement is achieved by dynamically changing the power amplifier supply voltage in response to the instantaneous changes in amplitude of the radio frequency (RF) signal to be amplified. This is in contrast to a simpler, but less effective efficiency enhancement called Average Power Tracking (APT), in which the power amplifier supply voltage is varied in response to the average amplitude of the RF signal to be amplified.

Another general characteristic of ET power amplifiers is that their efficiency tends to fall as the power output falls. This is because the ET supply voltage does not track the RF amplitude below a certain threshold voltage. At low supply voltages the power amplifier (PA) gain and phase tend to vary more rapidly, and it becomes difficult to control the PA power output or maintain acceptable modulation accuracy and spectral performance. For this reason, the ET system is designed so that the power amplifier supply voltage closely follows the RF signal amplitude at high instantaneous amplitudes, but at low instantaneous amplitudes the voltage remains at a fixed threshold. As the average power falls, the instantaneous power and supply voltage are below the threshold a greater percentage of the time, the voltage is at a fixed value a greater percentage of the time, and the supply system begins to look increasingly like the APT system.

Some conventional systems have used these efficiency characteristics to provide transitions between using the ET system at higher average powers and using the APT system at lower average powers in order to maintain optimal efficiency over all power levels. However, a transition between ET and APT techniques can cause undesired transients affecting signal quality or spectrum.

BRIEF DESCRIPTION OF THE DRAWINGS

The described embodiments are to be read in conjunction with the accompanying drawings, wherein.

DETAILED DESCRIPTION

Figure 1:
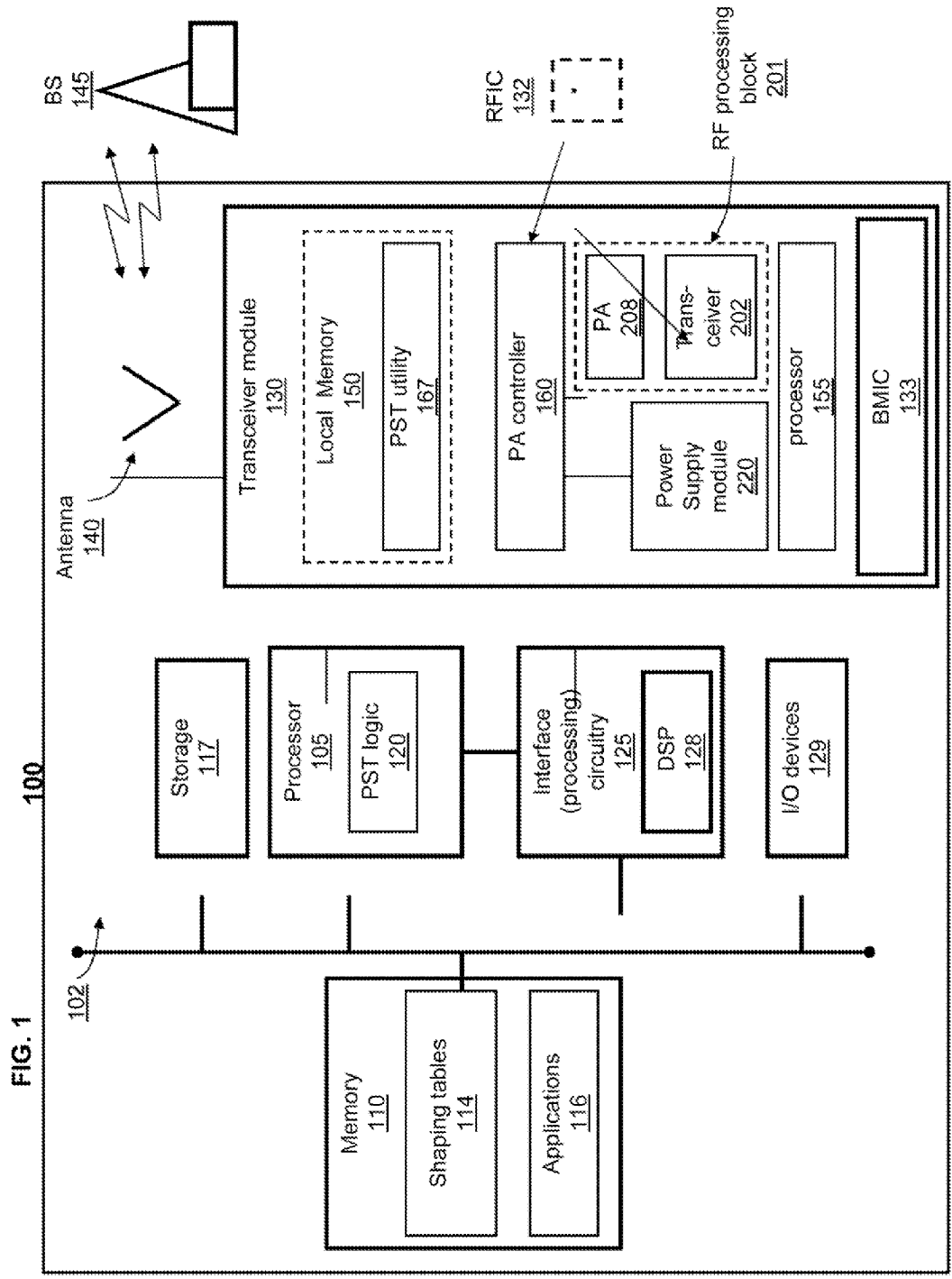
FIG. 1 is a block diagram illustrating an example wireless communication device within which the various features of the described embodiments can be advantageously implemented, according to one embodiment.

The illustrative embodiments provide a method and system for controlling a transition between utilizing an envelope tracking (ET) mechanism and using an average power tracking (APT) mechanism to provide power to a power amplifier. A power amplifier controller (PAC) initiates an ET mechanism to track changes in amplitudes of a radio frequency (RF) signal being received by the power amplifier. The PAC determines a bandwidth and an average amplitude of the RF signal. In response to an RF signal bandwidth being low and the average amplitude of the RF signal being at least equal to a threshold value, the PAC maintains activation of the ET mechanism and continues to provide instantaneous amplitudes of the RF signal to a DCDC converter. In response to at least one of (a) the RF signal bandwidth being high and (b) the average amplitude of the RF signal being less than the threshold value, the PAC temporarily deactivates the ET mechanism and controls a transition to utilizing the APT mechanism by properly synchronizing the transition to the change in average signal amplitude levels so there are no undesired transients affecting signal quality or spectrum.

In the following detailed description of exemplary embodiments of the disclosure, specific exemplary embodiments in which the various aspects of the disclosure may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense, and the scope of the present disclosure is defined by the appended claims and equivalents thereof.

Within the descriptions of the different views of the figures, similar elements are provided similar names and reference numerals as those of the previous figure(s). The specific numerals assigned to the elements are provided solely to aid in the description and are not meant to imply any limitations (structural or functional or otherwise) on the described embodiment.

It is understood that the use of specific component, device and/or parameter names, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

As further described below, implementation of the functional features of the disclosure described herein is provided within processing devices and/or structures and can involve use of a combination of hardware, firmware, as well as several software-level constructs (e.g., program code and/or program instructions and/or pseudo-code) that execute to provide a specific utility for the device or a specific functional logic. The presented figures illustrate both hardware components and software and/or logic components.

Those of ordinary skill in the art will appreciate that the hardware components and basic configurations depicted in the figures may vary. The illustrative components are not intended to be exhaustive, but rather are representative to highlight essential components that are utilized to implement aspects of the described embodiments. For example, other devices/components may be used in addition to or in place of the hardware and/or firmware depicted. The depicted example is not meant to imply architectural or other limitations with respect to the presently described embodiments and/or the general invention.

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein.

With specific reference now to FIG. 1, there is depicted a block diagram of an example wireless communication device 100, within which the functional aspects of the described embodiments may be implemented. Wireless communication device 100 represents a device that is adapted to transmit and receive electromagnetic signals over an air interface via uplink and/or downlink channels between the wireless communication device 100 and communication network equipment (e.g., base-station 145) utilizing a plurality of different communication standards, such as Global System for Mobile Communications (GSM) Code Division Multiple Access (CDMA), Orthogonal Frequency Division Multiple Access (OFDMA), Long Term Evolution (LTE) and similar systems. In one or more embodiments, the wireless communication device can be a mobile cellular device/phone or smartphone, or laptop, netbook or tablet computing device, or other types of communications devices. Wireless communication device 100 comprises processor 105 and interface circuitry 125, which are connected to memory component 110 via signal bus 102. Interface circuitry 125 includes digital signal processor (DSP) 128. Wireless communication device 100 also includes a transceiver module 130 for sending and receiving communication signals. In at least some embodiments, the sending and receiving of communication signals occur wirelessly and are facilitated by one or more antennas 140 coupled to the transceiver module 130. The number of antennas can vary from device to device, ranging from a single antenna to two or more antennas, and the presentation within wireless communication device 100 of one antenna 140 is merely for illustration.

Wireless communication device 100 is able to wirelessly communicate to base-station 145 via antenna 140. Base station 145 can be any one of a number of different types of network stations and/or antennas associated with the infrastructure of the wireless network and configured to support uplink and downlink communication via one or more of the wireless communication protocols, as known by those skilled in the art.

Transceiver module 130 comprises baseband modem integrated circuit (BMIC) 133 and radio frequency integrated circuit (RFIC) 132. In one embodiment, RFIC 132 comprises RF transceiver 202, local memory 150, PST utility 167, processor 155, and power amplifier controller 160. In an alternate embodiment, at least one of the components indicated as being included within RFIC 132 can be located outside of RFIC 132, within transceiver module 130. Transceiver module 130 also comprises a memory or storage system 117, power amplifier controller 160, power supply module 220 and RF processing block 201. RF processing block 201 comprises power amplifier 208, transceiver 202, and other processing block components shown in FIG. 2. In one implementation, power amplifier controller 160 is coupled to both power supply module 220 and power amplifier 208. In one embodiment, transceiver module 130 also includes local processor 155, which can be described as a digital signal processor (DSP). According to one aspect of the disclosure, local memory/storage 150 includes therein firmware, such as Power Supply Transition (PST) utility 167, which supports the various processing functions of transceiver module 130. The structural makeup of transceiver module 130 is described in greater detail in FIG. 2.

In addition to the above described hardware components of wireless communication device 100, various features of the invention may be completed/supported via software (or firmware) code and/or logic stored within at least one of memory 110 and local memory 150, and respectively executed by DSP 128, Processor 105, or local processor 155 of transceiver module 130. Thus, for example, illustrated within memory 110 and/or local memory 150 are a number of software/firmware/logic components/modules, including shaping tables 114, applications 116 and PST utility 167.

The various components within wireless communication device 100 can be electrically and/or communicatively coupled together as illustrated in FIG. 1. As utilized herein, the term "communicatively coupled" means that information signals are transmissible through various interconnections between the components. The interconnections between the components can be direct interconnections that include conductive transmission media, or may be indirect interconnections that include one or more intermediate electrical components. Although certain direct interconnections are illustrated in FIG. 1, it is to be understood that more, fewer or different interconnections may be present in other embodiments.

Figure 2:
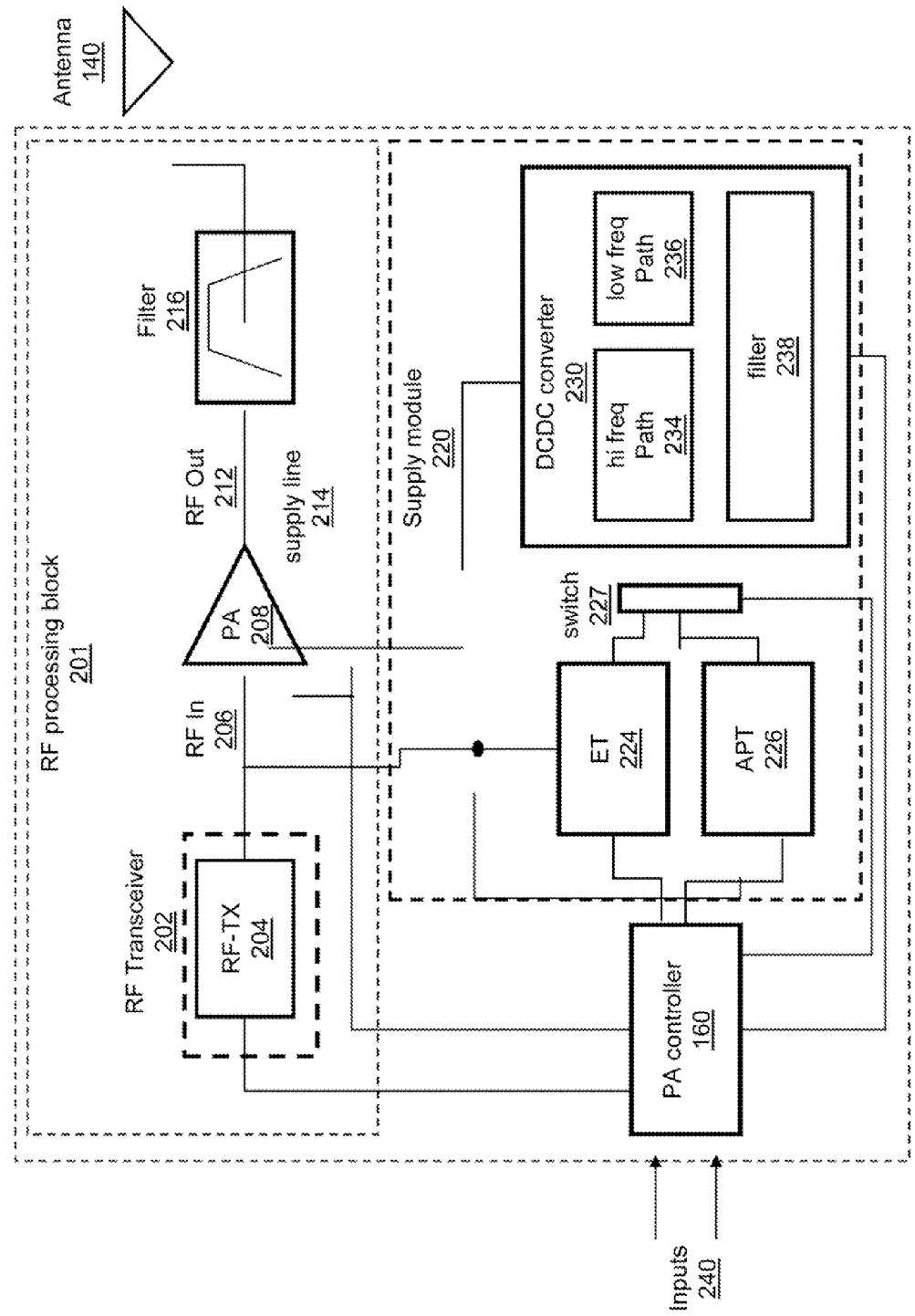
FIG. 2 provides a block diagram representation of a structural configuration of a transceiver module comprising a power amplifier that utilizes an envelope (ET) tracking mechanism, according to one embodiment.

FIG. 2 provides a block diagram representation of a structural configuration of transceiver module 130 comprising a power amplifier that utilizes an envelope (ET) tracking mechanism, according to one embodiment. Transceiver module 130 comprises radio frequency (RF) processing block 201 and dynamic power supply module 220. In addition, transceiver module 130 includes power amplifier (PA) controller 160 which manages an operation of power supply module 220. RF processing block 201 comprises RF transceiver 202, which includes RF transmitter (TX) 204 and an RF receiver (RX) (not shown). In one embodiment, RF transceiver 202 and power amplifier controller 160 constitute RFIC 132 (not shown). RF processing block 201 also comprises power amplifier (PA) 208 and filter 216. Filter 216 is coupled to an output port of power amplifier 208. Filter 216 is communicatively coupled to antenna 140. Also shown within RF processing block 201 is RF In 206 and RF Out 212, which respectively represent the input signal and the output signal of PA 208. Power is provided to PA 208 via supply line 214.

Dynamic supply module 220 comprises ET power supply module 224 and APT power supply module 226. ET power supply module 224 operates to provide an ET power supply mechanism, and APT power supply module 226 operates to provide an APT power supply mechanism. Dynamic supply module 220 also comprises DCDC converter 230 which further comprises a number of components that can be selectively coupled to and/or utilized respectively by ET power supply module 224 and APT power supply module 226. In particular, the components of DCDC converter 230 include high frequency processing path 234 and low frequency processing path 236. In addition, DCDC converter 230 comprises analog filter 238. In one embodiment, ET power supply module 224 and APT power supply module 226 are selectively coupled to DCDC converter 230 using switch 227.

Power amplifier controller 160 is coupled to both ET power supply module 224 and APT power supply module 226. Power amplifier controller 160 is also coupled to DCDC converter 230. In addition, power amplifier controller 160 is coupled to switch 227 to control access of ET power supply module 224 and APT power supply module 226 to DCDC converter 230. Power amplifier controller 160 receives inputs 240 which, in one implementation, include shaping tables 114 (FIG. 1).

In one embodiment, power amplifier controller 160 initiates a power tracking and power amplifier supply mechanism by utilizing an envelope tracking (ET) mechanism of ET module 224 to track changes in amplitudes of a radio frequency (RF) signal being received by power amplifier 208. In one or more implementations, power amplifier controller 160 initiates the ET mechanism as a default methodology for (a) tracking changes in amplitudes of the RF signal and (b) providing power to power amplifier 208 based on the tracked changes in amplitudes of the RF signal.

Power amplifier controller 160 determines a bandwidth (e.g., an LTE bandwidth) of the RF signal. In one embodiment, power amplifier controller 160 utilizes pre-established configuration data associated with a current mode of operation to determine the RF signal bandwidth. In addition, power amplifier controller 160 calculates an average amplitude of the RF signal based on the tracked changes in the RF signal amplitude.

In response to the RF signal having a low bandwidth and the average amplitude of the RF signal being at least equal to a threshold value, power amplifier controller 160 triggers ET module 224 to provide, to a first voltage controlled power converter such as DCDC converter 230, a first voltage control signal, which represents an instantaneous amplitude of the RF signal. The threshold value is determined by at least one of empirical analyses, simulations, and related calculations. When the average value of the RF signal amplitude is equal to the threshold value, the ET mechanism and the APT mechanism provides substantially equal efficiency levels. However, when the average value of the RF signal amplitude is greater than the threshold value, the ET mechanism provides greater efficiency than the APT mechanism. Finally, when the average value of the RF signal amplitude is less than the threshold value, the APT mechanism provides greater efficiency than the ET mechanism.

In response to at least one of (a) the RF signal having a high bandwidth and (b) the average amplitude of the RF signal being less than the threshold value, power amplifier controller 160 temporarily deactivates the ET mechanism. Furthermore, power amplifier controller 160 activates an average power tracking (APT) mechanism to trigger power supply module 220 to provide power using the average amplitude of the RF signal. Power amplifier controller 160 triggers ET module 224 to provide, to a second voltage controlled power converter, a second voltage control signal, which represents the average amplitude of the RF signal. While the APT mechanism is activated, if power amplifier controller 160 determines that the RF signal has a low bandwidth and the average amplitude is at least equal to the threshold value, power amplifier controller 160 temporarily deactivates the APT mechanism and activates or re-activates the ET mechanism. Power amplifier controller 160 enables power amplifier 208 to receive a power supply voltage having amplitude variations that are determined based on which tracking mechanism from among the ET mechanism and the APT mechanism is activated.

In one embodiment, a single configurable DCDC converter for providing an amplifier supply voltage is utilized by both ET module 224 and APT module 226. However, in another embodiment, ET module 224 and APT module 226 utilize two separate DCDC converters. When the single DCDC converter is utilized by both ET module 224 and APT module 226, power amplifier controller 160 configures the single DCDC converter, such as DCDC converter 230, to enable respective components of DCDC converter 230 to be selectively coupled to and/or utilized by ET power supply module 224 and APT power supply module 226. For example, in one embodiment, ET power supply module 224 utilizes both high frequency processing path 234 and low frequency processing path 236 and APT power supply module 226 utilizes low frequency processing path 236. A DCDC converter utilized by ET module 224 is further described in FIG. 3.

Power amplifier controller 160 controls the transition from utilizing the ET mechanism to utilizing the APT mechanism by properly synchronizing the transition to the change in average signal amplitude levels so that there are no undesired transients affecting signal quality or spectrum. This synchronized transition from utilizing the ET mechanism to utilizing the APT mechanism is further described utilizing the timing diagram of FIG. 4.

Figure 3:
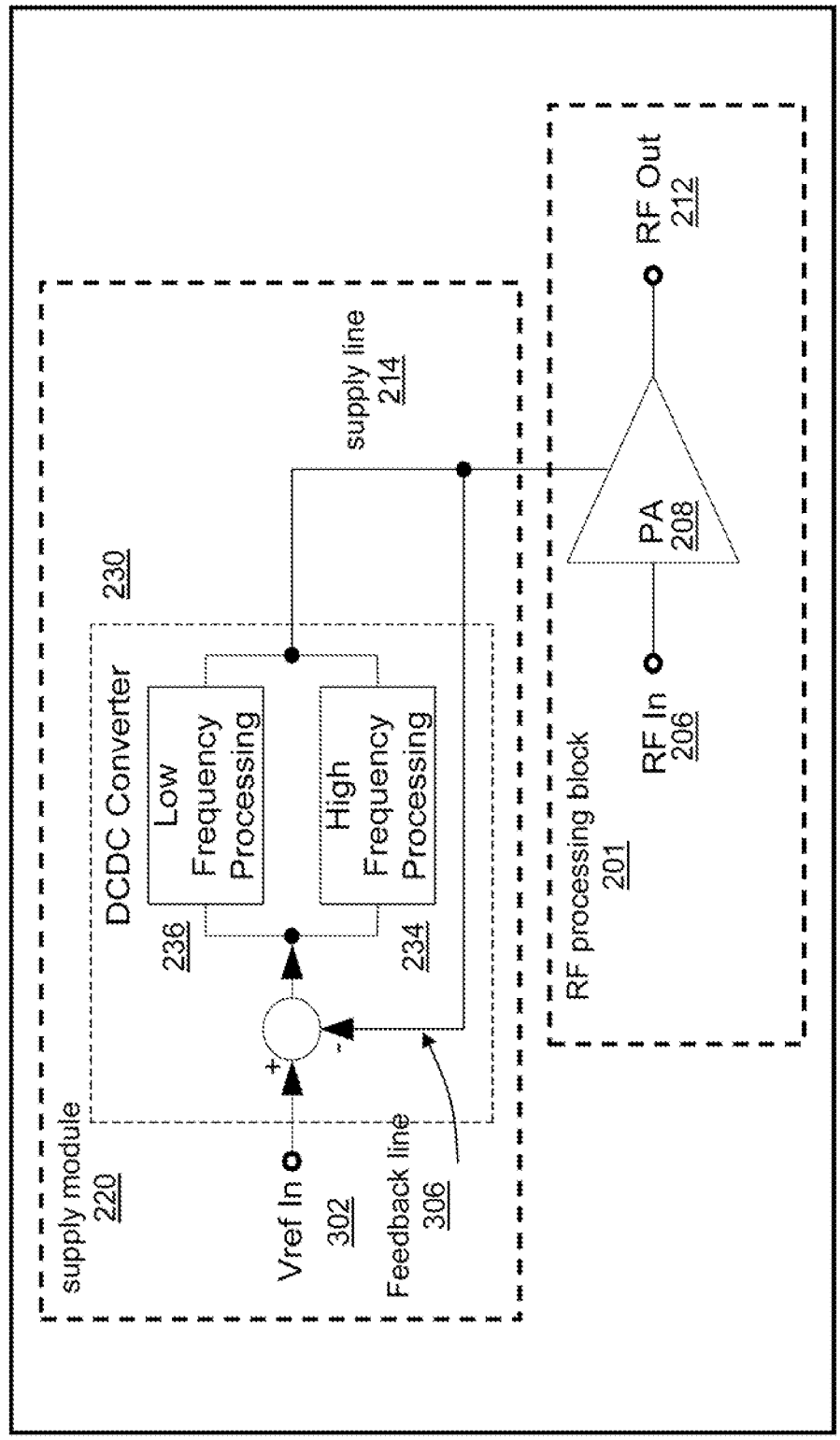
FIG. 3 is a block diagram illustrating an embodiment of transceiver module comprising an ET module within a power supply module and a power amplifier which receives power from the ET module, according to one embodiment.

FIG. 3 is a block diagram illustrating an embodiment of Transceiver Module 130 comprising an ET module within a power supply module and a power amplifier which receives power from the ET module, according to one embodiment. Transceiver module 130 comprises DCDC converter 230 of supply module 220 and power amplifier 208 of RF processing block 201. DCDC converter 230 comprises high frequency processing path 234 and low frequency processing path 236. In the illustrated configuration of FIG. 3, DCDC converter 230 provides an ET converter system. As illustrated, when DCDC converter 230 is configured as an ET converter system, the respective output ports of low frequency processing path 236 and high frequency processing path 234 are combined.

In one embodiment, components of low frequency processing path 236 are also utilized to provide a DCDC converter for the APT mechanism. In one implementation, low frequency processing path 236 has a lower operating frequency (e.g., 2 MHz) and lower response bandwidths (e.g., 200 kHz) to the RF envelope signal at Vref In port 302. Thus, the DCDC conversion efficiency of low frequency processing path 236 is relatively high. In contrast, high frequency processing path 234 can be implemented with lower efficiency amplifier stages such as push-pull amplifiers, which have much wider response bandwidths at a reduced efficiency. The low and high frequency processing paths are summed together, and a control loop utilizing feedback line 306 processes the composite output to track the reference signal input at Vref In port 302. In practice, the low frequency content of the composite output is generated from low frequency processing path 236, and only the higher frequency content is processed through the lower efficiency high frequency processing path 234.

When power amplifier controller 160 triggers a transition between using ET at higher average RF signal powers and using APT at lower average RF signal powers, high frequency processing path 234 is disabled at the low average powers to improve efficiency. In one implementation, high frequency processing path 234 provides suppression of DCDC switching spurs through the action of the control loop. In one embodiment, additional filtering is provided for low frequency path 236 to suppress switching spurs when power amplifier controller 160 triggers the transition from using ET at higher average powers to using APT at lower average powers.

Power amplifier controller 160 optimizes power amplifier efficiency associated with an ET mechanism by employing shaping tables that define how closely the PA supply waveform attempts to track the amplitude of the RF signal to be amplified. A more aggressive shaping table that follows the RF signal very closely will compress the PA further and provide better efficiency but worse adjacent channel leakage ratio (ACLR). In one embodiment, power amplifier specifications are defined assuming that all resource blocks are allocated, which is the worst case for ACLR. In general, any ET shaping table that is selected by power amplifier controller 160 is required to meet this worst case ACLR, but for lesser resource block allocations, a more aggressive shaping table could be employed.

Figure 4:
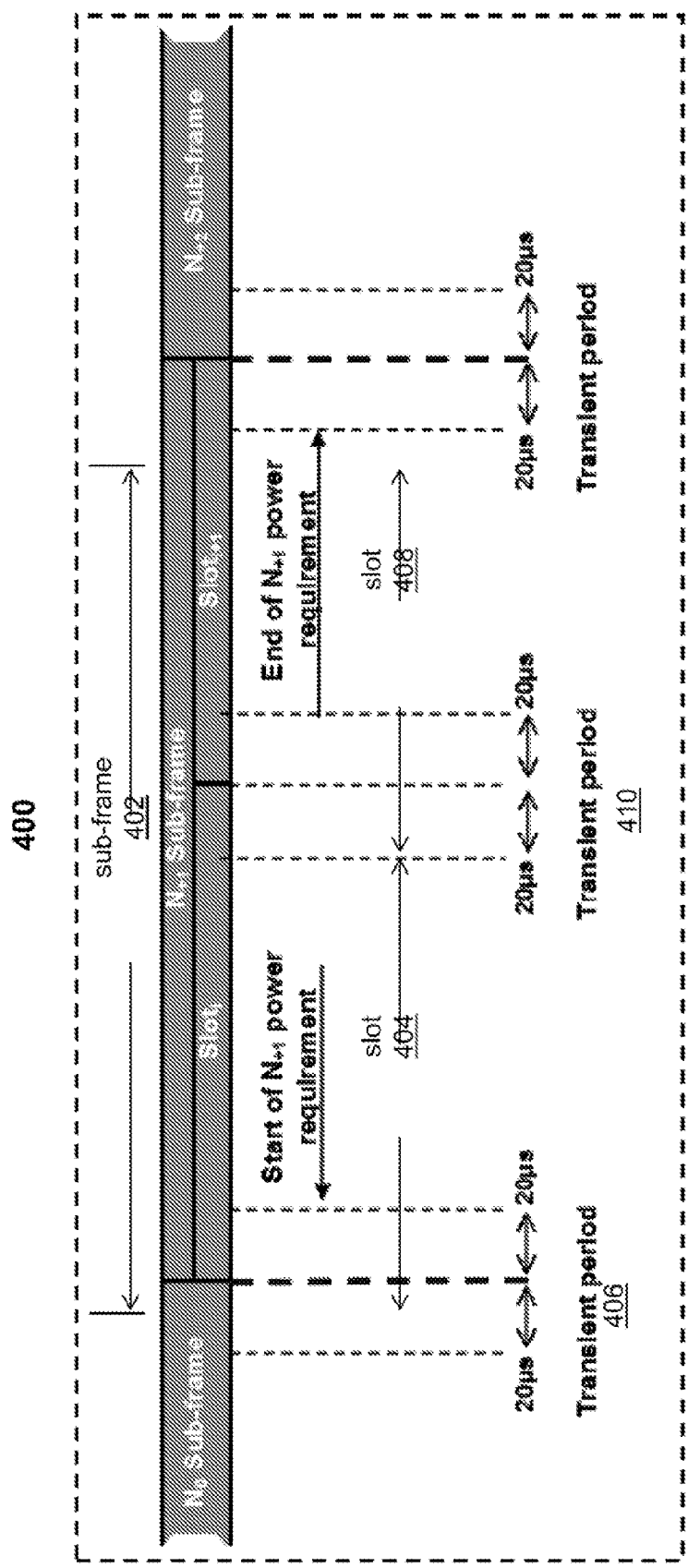
FIG. 4 is a timing diagram illustrating slot and sub-frame boundaries for Long Term Evolution (LTE) along with the transition regions for switching between the ET and APT mechanisms, according to one embodiment.

FIG. 4 is a timing diagram illustrating slot and sub-frame boundaries for LTE along with the transition regions for switching between the ET and APT mechanisms, according to one embodiment. Timing diagram 400 comprises a number of sub-frames including sub-frame 402. Sub-frame 402 comprises slot 404 and slot 408. Also illustrated within timing diagram 400 are a number of transient or transition periods 406 and 410, which are centered about respective adjacent slot boundaries.

The LTE standard allows signal variations in magnitude and phase during a pre-defined time window (e.g., transition periods 406 and 410 or transition periods 410 and 412) around slot and sub-frame boundaries with the following constraints: (a) shifts in slot to slot or sub-frame to sub-frame average phase are minimized; and (b) amplitude variations do not overshoot a pre-defined amplitude range by more than a threshold level. In one embodiment, these LTE standard constraints about signal variations are utilized to provide at least one of design parameters and configuration parameters of power supply module 220 (FIG. 1) to ensure high performance of the ET and APT mechanisms for providing power to a corresponding power amplifier.

In one embodiment, when transitioning between using the ET and APT mechanism for providing power to a corresponding power amplifier, power amplifier controller 160 provides a gradual signal change by using a pre-defined low rate of change from a first supply signal provided by a first tracking and power supply mechanism (e.g., the ET mechanism) to power amplifier 208 to a second supply signal provided by a second tracking and power supply mechanism (e.g., the APT mechanism) to power amplifier 208. Power amplifier controller 160 controls power supply levels to prevent, during a transition from the first supply signal to the second supply signal, signal amplitudes from overshooting an amplitude range defined by the amplitude levels of the first and second voltage controlled supply signals by more than a threshold level. The transition occurs within a pre-determined time window substantially centered about a boundary between a pair of time slots within which signal transmissions are provided. The pre-determined time window enables changes in modulation parameters and supply signals to be provided.

Figure 5:
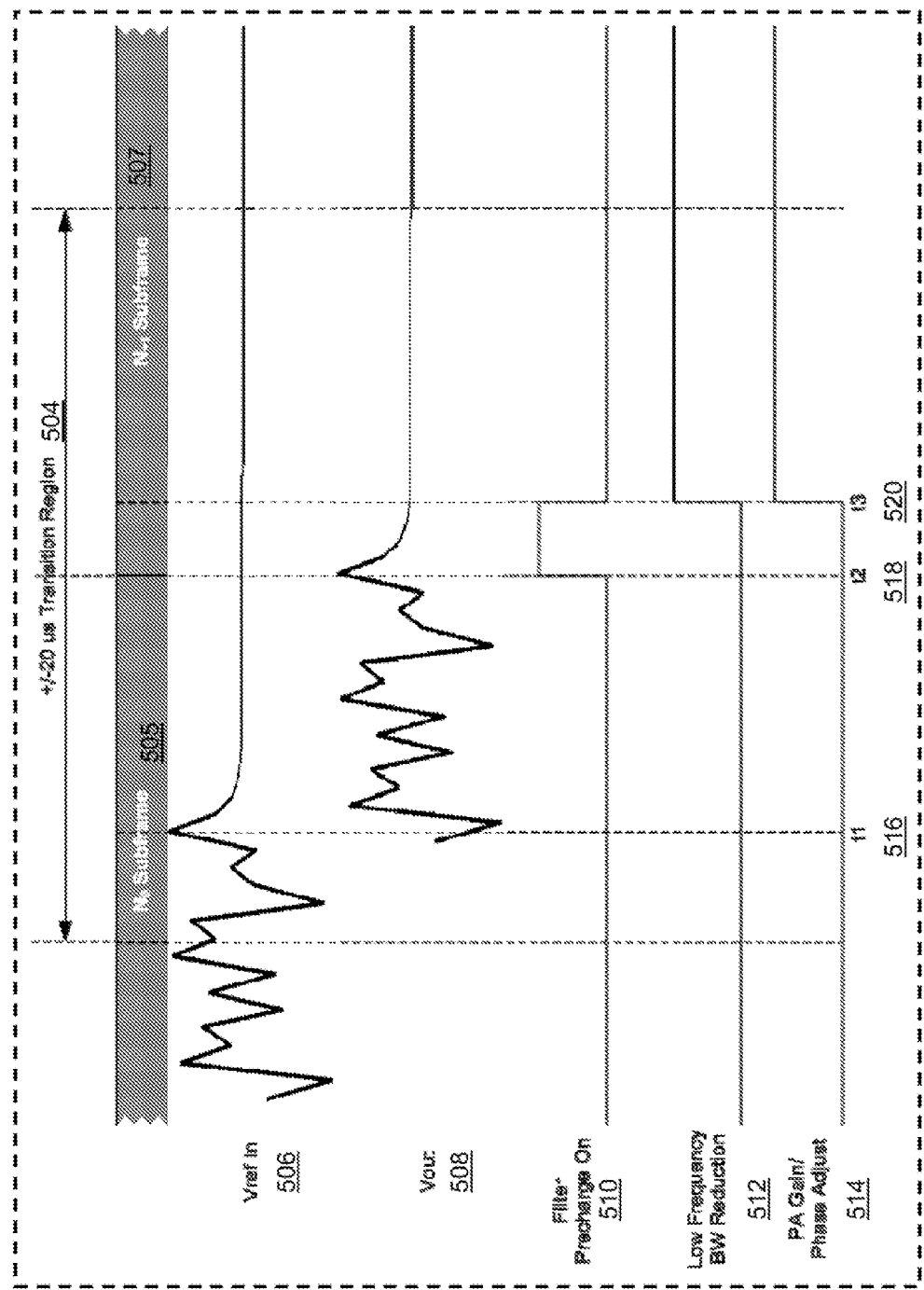
FIG. 5 is a chart illustrating the allowable signal variations within the transition region when switching from the ET mechanism to the APT mechanism, according to one embodiment.

FIG. 5 is a chart illustrating the allowable signal variations within the transition region when switching from the ET mechanism to the APT mechanism, according to one embodiment. In one embodiment, power amplifier controller 160 triggers a transition from using the ET mechanism at a higher RF power level to using the APT mechanism at a lower RF power level in order to maintain optimal efficiency with required noise performance. In another embodiment, power amplifier controller 160 initiates a transition when switching from using the ET mechanism at lower resource block allocations to using the APT mechanism at higher resource block allocations. Chart 500 comprises +/−20 us transition region 504, $N_0$ sub-frame 505 and $N_{+1}$ sub-frame 507. In addition, timing diagram 500 provides a number of waveforms including Vref In 506 and Vout 508. In addition, timing waveforms for a number of events including "filter pre-charge on" 510, "low frequency BW reduction" 512 and "PA Gain/Phase Adjust" 514 are illustrated. Also illustrated in timing diagram 500 and within +/−20 us transition region 504 are a number of timing instances, which include t1 516, t2 518 and t3 520.

At time t1 516 the transition begins when the reference voltage, Vref In 506, no longer specifically tracks the instantaneous RF amplitude changes. Instead, Vref In 506 smoothly transitions to the desired APT voltage for $N_{+1}$ subframe 507. Power amplifier controller 160 performs this transition using a predefined waveform such as a raised cosine or similar spectrally controlled time response. Because DCDC converter 230 configured as an ET converter is still fully operational, the transition can occur as quickly as spectral considerations allow. For the case of a 1.4-20 MHz LTE signal the transition can occur in less than 1 microsecond (i.e., in much less time than the allowed 20 microseconds) with insignificant spectral impact. The t1 516 is timed sufficiently ahead of t2 518, the sub-frame boundary, so that after accounting for filter delays the transition begins at the slot boundary. In timing diagram 500, the delay between Vref In 506 and Vout 508 is exaggerated for clarity.

When power amplifier controller 160 initiates a switch from using the ET mechanism to using the APT mechanism and causes DCDC converter 230 to stop tracking the signal envelope, high frequency processing path 234 is disabled. However, in one embodiment, power amplifier controller 160 configures DCDC converter 230 to utilize additional filtering in the form of analog filtering provided by filter 238 to control the spurious output of low frequency processing path 236. Power amplifier controller 160 prevents an unacceptable transient in the power supply to power amplifier 208 by pre-charging the additional filtering to the desired DCDC output level prior to switching the filter onto low frequency processing path 236. Power amplifier controller 160 initiates pre-charging of the filter at t2 518 in order for the pre-charging to be completed by time t3 520. As a result, power amplifier controller 160 enables the completion of filter pre-charging to coincide with the bandwidth reduction operation, which also occurs at t3 520. Filter 238, which provides the additional filtering, is switched on and high frequency processing path 234 is turned off at t3 520. As a result, DCDC converter 230 provides a reduced bandwidth at increased efficiency for the low power APT mechanism or operation.

In order to prevent an undesired shift in transmit output power or average phase when the DCDC converter changes from ET mode to a fixed supply voltage of the APT mode, power amplifier controller 160 triggers the RF transceiver to adjust an amplitude and/or phase of the RF input signal to provide a power amplifier gain/phase adjustment at t3 520 in response to disabling high frequency processing path 234. The gain adjustment may be a fixed step change in the transmitter power control to compensate for the power amplifier gain change, and may be factory calibrated or simply stored in memory based on measured power amplifier characteristics. The phase adjustment may similarly be factory calibrated or based on pre-measured characteristics. A more complex adjustment than a simple step may also be employed for larger power transitions as needed to control transients.

In one embodiment, power amplifier controller 160 initiates a transition between using the ET mechanism at lower resource block allocations and using the APT mechanism at higher resource block allocations in order to maintain optimal efficiency with required noise performance. In particular, when the ET mechanism is activated and power amplifier controller 160 determines that the resource block frequency allocation of the RF signal is at least equal to a threshold allocation value, power amplifier controller 160 disables high frequency processing path 234 of DCDC converter 230 in order to provide enhanced noise performance. As previously described, power amplifier controller 160 controls the transition from the ET mechanism to the APT mechanism to prevent an undesired spectral impact.

In one embodiment, power amplifier controller 160 initiates a transition between using a first shaping table and a second shaping table while the ET mechanism is activated in order to maintain optimal efficiency with required noise performance. In particular, when the ET mechanism is activated and the resource block frequency allocation of the RF signal is less than a threshold allocation value and lower than a low threshold value that is lower than the threshold allocation value, power amplifier controller 160 selects an aggressive shaping table from among a collection of shaping tables which include shaping tables having different levels of aggressiveness. Each of the shaping tables respectively maps an instantaneous RF envelope to a particular supply voltage. A more aggressive shaping table is more closely correlated with the RF signal being amplified and, when utilized, the more aggressive shaping table enables power amplifier 208 to operate closer to a power amplifier compression point and attain higher amplifier efficiency with an increased adjacent channel leakage ratio (ACLR). In response to the ET mechanism being activated and the resource block frequency allocation being less than the threshold allocation value and higher than the low threshold value, power amplifier controller 160 selects a less aggressive shaping table. In response to initiating a switch between using a less aggressive shaping table and using a more aggressive shaping table, power amplifier controller 160 provides at least one of a gain adjustment and a phase adjustment when the switch is completed. Power amplifier controller 160 executes the ET mechanism by utilizing the selected shaping table to track the amplitude of the RF signal.

Figure 6:
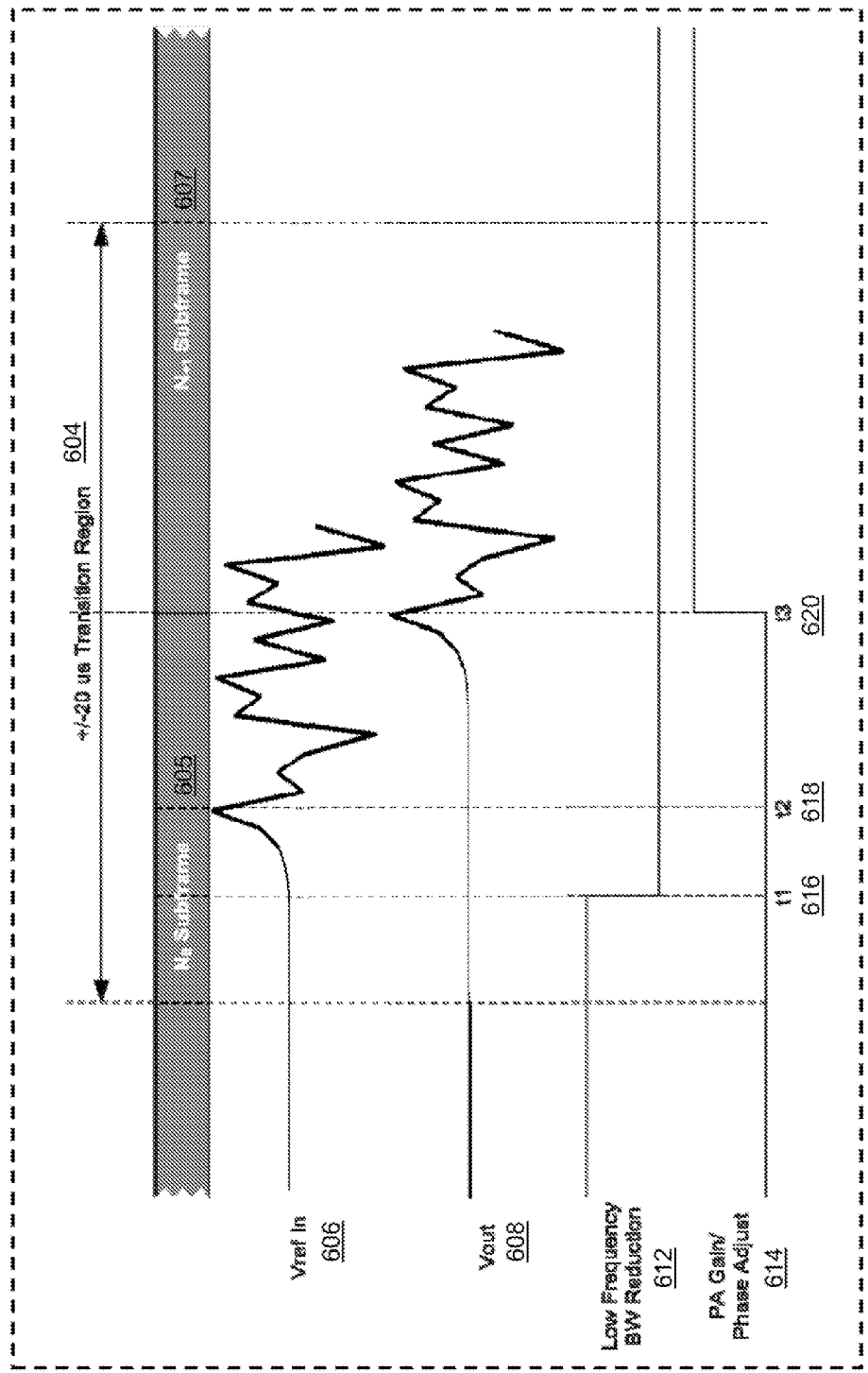
FIG. 6 is a chart illustrating the allowable signal variations within the transition region when switching from the APT mechanism to the ET mechanism, according to one embodiment.

FIG. 6 is a second chart illustrating the allowable signal variations within the transition region when switching from the APT mechanism to the ET mechanism, according to one embodiment. Chart 600 comprises +/−20 us transition region 604, $N_0$ subframe 605 and $N_{+1}$ subframe 607. In addition, timing diagram 600 provides a number of waveforms including Vref In 606 and Vout 608. In addition, timing waveforms for a number of events including "low frequency BW reduction" 612 and "PA Gain/Phase Adjust" 614 are illustrated. Also illustrated in chart 600 and within transition region 604 are a number of timing instances, which include t1 616, t2 618 and t3 620.

In chart 600, power amplifier controller 160 initiates a transition from using the APT mechanism at higher resource block allocations to using the ET mechanism at lower resource block allocations in order to maintain optimal efficiency with required noise performance. Similarly, a transition from using the APT mechanism at a lower RF power level to using the ET mechanism at a higher RF power level occurs in order to maintain optimal efficiency with required noise performance. The transition begins at t1 616 when high frequency processing path 234 of DCDC converter 230 is enabled. Concurrent with enabling high frequency processing path 234, power amplifier controller 160 removes any additional filtering that was previously added when only low frequency processing path 236 was enabled. Power amplifier controller 160 specifically sets the timing associated with enabling high frequency processing path 234 so that after accounting for the delays present when DCDC converter 230 is configured within a high bandwidth mode, ET functionality can begin at t3 620 when the low resource block allocation takes effect. Furthermore, power amplifier controller 160 sets and utilizes a specific timing so that the supply voltage ET waveform for power amplifier 208 and the RF modulation waveform are synchronized. By properly synchronizing these waveforms, power amplifier controller 160 prevents severe distortion, ACLR, receiver noise and modulation accuracy failures from occurring.

In addition, at t1 616, the envelope modulation for the low resource block allocation is applied to an input port of DCDC converter 230. Instead of simply being switched on, the envelope modulation voltage is smoothly transitioned to the ET waveform for $N_{+1}$ sub-frame 607. This transition to an ET waveform provided by the ET mechanism is made with a predefined function such as a raised cosine or another function that provides a similar spectrally controlled time response. An example of a function providing such a transition is:

$$V_{out} = \begin{cases} V_{PLT} & t < t_1 \\ V_{PLT}\left[\frac{1}{2} + \frac{1}{2}\cos\left(\frac{t-t_1}{t_2-t_1}\pi\right)\right] + V_{ET}\left[\frac{1}{2} - \frac{1}{2}\cos\left(\frac{t-t_1}{t_2-t_1}\pi\right)\right] & t_1 \leq t \leq t_2 \\ V_{ET} & t > t_2 \end{cases}$$

A power amplifier gain and/or phase adjustment is also applied at t3 620 to account for changes in the power amplifier complex gain as the supply voltage of power amplifier 208 is changed from a constant APT voltage to a variable ET voltage.

In one embodiment, power amplifier controller 160 initiates a transition from using the APT mechanism at higher resource block allocations and using the ET mechanism at lower resource block allocations in order to maintain optimal efficiency with required noise performance. In particular, when the APT mechanism is activated and power amplifier controller 160 determines that the resource block frequency allocation of the RF signal is less than the threshold allocation value, power amplifier controller 160 enables high frequency processing path 234 of the DCDC converter 230 to provide enhanced power amplifier efficiency. Power amplifier controller 160 concurrently disables an additional filtering previously added when only low frequency processing path 236 was enabled. In addition, power amplifier controller 160 provides at least one of a gain adjustment and a phase adjustment when the ET mechanism is activated.

Figure 7:
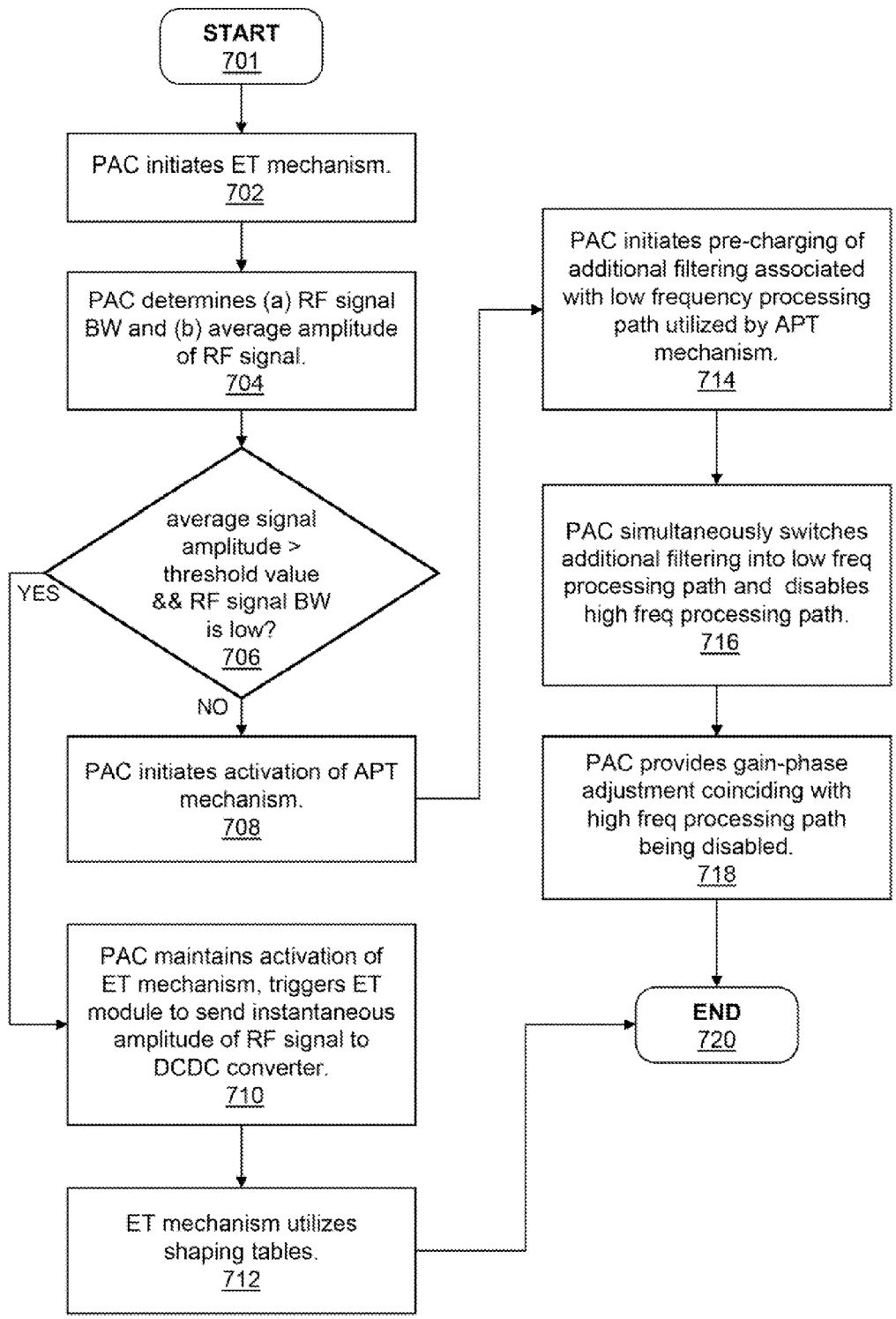
FIG. 7 is a flow chart illustrating one embodiment of a method for managing a transition from utilizing an ET mechanism to using an APT mechanism to provide power to a power amplifier within a wireless communication device.
Figure 8:
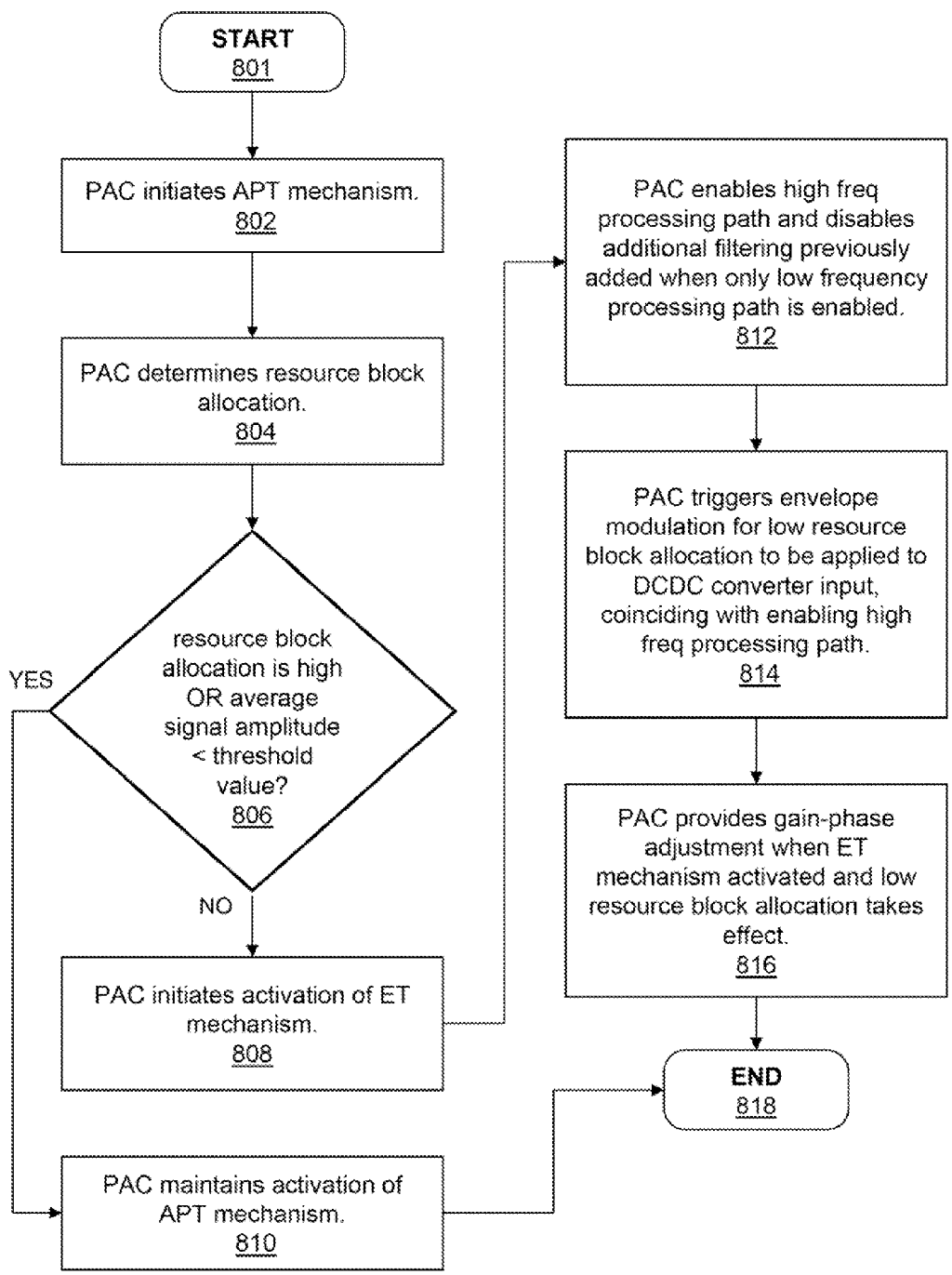
FIG. 8 is a flow chart illustrating one embodiment of a method for managing a transition from utilizing the APT mechanism to using the ET mechanism to provide power to a power amplifier within a wireless communication device.

FIGS. 7 and 8 are flow charts illustrating embodiments of the methods by which the above processes of the illustrative embodiments can be implemented. Specifically, FIG. 7 illustrates one embodiment of a method for managing a transition from utilizing an ET mechanism to using an APT mechanism to provide power to a power amplifier. FIG. 8 illustrates one embodiment of a method for managing a transition from utilizing the APT mechanism to using the ET mechanism to provide power to a power amplifier. Although the methods illustrated by FIGS. 7 and 8 may be described with reference to components and functionality illustrated by and described in reference to FIGS. 1-6, it should be understood that this is merely for convenience and alternative components and/or configurations thereof can be employed when implementing the method. Certain portions of the methods may be completed by PST utility 167 executing on one or more processors (processor 105 or DSP 128) within wireless communication device 100 (FIG. 1), or a processing unit or power amplifier controller 160 of RFIC 132 (FIG. 1). The executed processes then control specific operations of or on RFIC 132. For simplicity in describing the method, all method processes are described from the perspective of RFIC 132 and specifically power amplifier controller 160.

The method of FIG. 7 begins at initiator block 701 and proceeds to block 702 at which power amplifier controller 160 initiates the ET mechanism to track an amplitude of an RF signal being propagated to power amplifier 208. At block 704, power amplifier controller 160 determines (a) the RF signal bandwidth (BW) and (b) the average amplitude of the RF signal.

At decision block 706, power amplifier controller 160 determines whether (a) the average signal amplitude is greater than a threshold value and (b) the RF signal BW is low. If at decision block 706 power amplifier controller 160 determines that (a) the average signal amplitude is greater than the threshold value and (b) the RF signal BW is low, power amplifier controller 160 maintains activation of the ET mechanism and triggers ET module 224 to send an instantaneous amplitude of the RF signal to DCDC converter 230, as shown at block 710. Following block 710, the process moves to block 712 at which the ET mechanism utilizes shaping tables, according to a resource block allocation. However, if at decision block 706 power amplifier controller 160 determines that (a) the average signal amplitude is not greater than the threshold value and/or (b) the RF signal BW is not low, power amplifier controller 160 initiates activation of the APT mechanism, as shown at block 708.

Following block 708, the process moves to block 714 at which power amplifier controller 160 initiates pre-charging of an additional filtering associated with low frequency processing path 236 utilized by the APT mechanism. At block 716, power amplifier controller 160 simultaneously switches the additional filtering into low frequency processing path 236 and disables high frequency processing path 234. At block 718, power amplifier controller 160 provides at least one of a gain adjustment and a phase adjustment concurrent with high frequency processing path 234 being disabled. Blocks 708, 714, 716 and 718 describe processes involved in transitioning from actively utilizing the ET mechanism to utilizing the APT mechanism. The transition is started at a preset time period before the sub-frame boundary to account for delays associated with the DCDC converter and, as a result, to enable the required, time synchronized waveform to appear at the power amplifier on the sub-frame boundary. The process ends at block 720.

The method of FIG. 8 begins at initiator block 801 and proceeds to block 802 at which power amplifier controller 160 initiates the APT mechanism to track an amplitude of an RF signal being propagated to power amplifier 208. At block 804, power amplifier controller 160 determines (a) the resource block allocation of the RF signal and (b) the average amplitude of the RF signal. At decision block 806, power amplifier controller 160 determines whether (a) the resource block allocation of the RF signal is high (i.e., exceeds a pre-established allocation threshold value) and (b) the average amplitude of the RF signal is less than a preset power threshold value. If at decision block 806 power amplifier controller 160 determines that the resource block allocation of the RF signal is high or the average amplitude of the RF signal is less than the preset power threshold value, power amplifier controller 160 maintains activation of the APT mechanism, as shown at block 810. The process ends at block 818. However, if at decision block 806 power amplifier controller 160 determines that the resource block allocation of the RF signal is not high and the average amplitude of the RF signal is at least equal to the preset power threshold value, power amplifier controller 160 initiates activation of the ET mechanism, as shown at block 808.

Following block 808, the process moves to block 812 at which power amplifier controller 160 enables high frequency processing path 234 and disables additional filtering previously added when only low frequency processing path 236 is enabled. At block 814, power amplifier controller 160 triggers envelope modulation for low resource block allocation to be applied to DCDC converter input, coinciding with enabling high frequency processing path 234. At block 816, power amplifier controller 160 provides at least one of a gain adjustment and a phase adjustment when the low resource block allocation takes effect and the ET mechanism is activated. The process ends at block 818.

The flowcharts and block diagrams in the various figures presented and described herein illustrate the architecture, functionality, and operation of possible implementations of systems, methods and computer program products according to various embodiments of the present disclosure. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Thus, while the method processes are described and illustrated in a particular sequence, use of a specific sequence of processes is not meant to imply any limitations on the disclosure. Changes may be made with regards to the sequence of processes without departing from the spirit or scope of the present disclosure. Use of a particular sequence is therefore, not to be taken in a limiting sense, and the scope of the present disclosure extends to the appended claims and equivalents thereof.

In some implementations, certain processes of the methods are combined, performed simultaneously or in a different order, or perhaps omitted, without deviating from the spirit and scope of the disclosure. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method for providing supply power to a power amplifier, the method comprising:
    initiating an envelope tracking (ET) mechanism to track changes in amplitudes of a radio frequency (RF) signal being received by the power amplifier;
    providing an instantaneous amplitude of the RF signal to a first configuration of a voltage controlled power converter from the ET mechanism;
    determining a bandwidth of the radio frequency (RF) signal;
    calculating an average amplitude of the RF signal;
    in response to at least one of (a) a RF signal bandwidth being at least equal to a threshold bandwidth and (b) the average amplitude of the RF signal being less than a threshold value:
        temporarily deactivating the ET mechanism;
        activating an average power tracking (APT) mechanism to trigger a power supply to provide power using the average amplitude of the RF signal;
        providing, to a second configuration of the voltage controlled power converter, an average amplitude of the RF signal; and
    providing to the power amplifier a power supply voltage having amplitude variations that are determined based on which tracking mechanism from among the ET mechanism and the APT mechanism is activated.

2. The method of claim 1, further comprising:
    in response to a switch from the ET mechanism to the APT mechanism occurring: pre-charging at a first time instant an analog filter to a pre-established power converter output value; completing said pre-charging at a second time instant; and in response to the pre-charging being completed at the second time instant: initiating filtering on a low frequency processing path of the power converter using the analog filter; disabling a high frequency processing path of the power converter; and providing at least one of a gain adjustment and a phase adjustment at a third time instant; and
    in response to a switch from the APT mechanism to the ET mechanism occurring: enabling a high frequency processing path of the power converter; disabling an additional filtering previously added when only the low frequency processing path is enabled; and providing at least one of a gain adjustment and a phase adjustment when the ET mechanism is activated.

3. The method of claim 1, further comprising:
    determining a resource block frequency allocation of the RF signal;
    in response to the ET mechanism being activated and the resource block frequency allocation of the RF signal being less than a threshold allocation value and lower than a low threshold value, selecting an aggressive shaping table from among a collection of shaping tables which include shaping tables having different levels of aggressiveness, wherein each of said shaping tables respectively map an instantaneous RF envelope to an applied supply voltage;
    in response to the ET mechanism being activated and the resource block frequency allocation being less than the threshold allocation value and higher than the low threshold value, selecting a less aggressive shaping table;
    in response to initiating a switch between using a less aggressive shaping table and using a more aggressive shaping table, providing at least one of a gain adjustment and a phase adjustment when the switch is completed; and
    executing the ET mechanism by utilizing the selected shaping table to track the amplitude of the RF signal.

4. The method of claim 3, further comprising:
    in response to the ET mechanism being activated and the resource block frequency allocation being at least equal to the threshold allocation value, disabling a high frequency processing path of a corresponding power converter to provide enhanced noise performance; and
    in response to the APT mechanism being activated and the resource block frequency allocation being less than the threshold allocation value: enabling the high frequency processing path of the corresponding power converter to provide enhanced power amplifier efficiency; disabling an additional filtering previously added when the low frequency processing path is enabled and the high frequency processing path is disabled; and providing at least one of a gain adjustment and a phase adjustment when the ET mechanism is activated.

5. The method of claim 4, wherein said disabling a high frequency processing path further comprises:
  in response to the resource block frequency allocation being at least equal to the threshold allocation value, pre-charging at a first time instant an analog filter to a desired power converter output value;
  completing said pre-charging at a second time instant;
  in response to the pre-charging being completed at the second time instant: initiating filtering on a low frequency path of the corresponding power converter using the analog filter; and disabling a high frequency processing path of the corresponding power converter;
  in response to disabling a high frequency processing path of the corresponding power converter, providing one of a single fixed step power amplifier gain adjustment and multiple step power amplifier gain adjustments; and
  providing a phase adjustment concurrent with disabling the high frequency processing path of the corresponding power converter.

6. The method of claim 1, wherein said providing the power supply voltage further comprises:
  providing a gradual signal change by using a pre-defined low rate of change from a first supply signal provided to the power amplifier to a second supply signal provided to the power amplifier; and
  controlling power supply levels to prevent, during a transition from the first supply signal to the second supply signal, signal amplitudes from overshooting an amplitude range defined by the amplitude levels of the first and second voltage controlled supply signals by more than a threshold level, wherein said transition occurs within a pre-determined time window substantially centered about a boundary between a pair of time slots within which signal transmissions are provided, wherein said pre-determined time window enables changes in modulation parameters and supply signals to be provided.

7. The method of claim 1, wherein:
  the first configuration of the voltage controlled power converter is a first configuration of a first DCDC converter;
  the second configuration of the voltage controlled power converter is one of (a) a second configuration of the first DCDC converter and (b) a second DCDC converter;
  the ET mechanism utilizes the first DCDC converter;
  the APT mechanism utilizes one of the first DCDC converter and the second DCDC converter; and
  in response to the ET mechanism and the APT mechanism both utilizing the first DCDC converter, the ET mechanism selectively utilizes a first set of components included within the first DCDC converter and the APT mechanism selectively utilizes a second set of components included within the first DCDC converter.

8. A transceiver module comprising:
  at least one radio frequency integrated circuit (RFIC);
  a power amplifier;
  an envelope tracking (ET) supply module;
  an average power tracking (APT) supply module;
  a power amplifier controller located within the at least one radio frequency integrated circuit (RFIC) and coupled to the ET supply module and to the APT supply module and which:
    initiates an envelope tracking (ET) mechanism to track changes in amplitudes of a radio frequency (RF) signal being received by the power amplifier;
    provides an instantaneous amplitude of the RF signal to a first configuration of a voltage controlled power converter from the ET mechanism;
    determines a bandwidth of the radio frequency (RF) signal;
    calculates an average amplitude of the RF signal;
    in response to at least one of (a) the RF signal bandwidth being at least equal to a threshold bandwidth and (b) the average amplitude of the RF signal being less than a threshold value:
      temporarily deactivates the ET mechanism;
      activates an average power tracking (APT) mechanism to trigger a power supply to provide power using the average amplitude of the RF signal;
      provides, to a second configuration of the voltage controlled power converter, an average amplitude of the RF signal; and
    provides to the power amplifier a power supply voltage having amplitude variations that are determined based on which tracking mechanism from among the ET mechanism and the APT mechanism is activated.

9. The transceiver module of claim 8, wherein the power amplifier controller:
  in response to a switch from the ET mechanism to the APT mechanism occurring: pre-charges at a first time instant an analog filter to a pre-established power converter output value; completes said pre-charging at a second time instant; and in response to the pre-charging being completed at the second time instant: initiates filtering on a low frequency processing path of the power converter using the analog filter; disables a high frequency processing path of the power converter; and provides at least one of a gain adjustment and a phase adjustment at a third time instant; and
  in response to a switch from the APT mechanism to the ET mechanism occurring: enables a high frequency processing path of the power converter; disables an additional filtering previously added when the low frequency processing path is enabled and the high frequency processing path is disabled; and provides at least one of a gain adjustment and a phase adjustment when the ET mechanism is activated.

10. The transceiver module of claim 8, wherein the power controller:
  determines a resource block frequency allocation of the RF signal;
  in response to the ET mechanism being activated and the resource block frequency allocation of the RF signal being less than a threshold allocation value and lower than a low threshold value, selects an aggressive shaping table from among a collection of shaping tables which include shaping tables having different levels of aggressiveness, wherein each of said shaping tables respectively map an instantaneous RF envelope to an applied supply voltage;
  in response to the ET mechanism being activated and the resource block frequency allocation being less than the threshold allocation value and higher than the low threshold value, selects a less aggressive shaping table;
  in response to initiating a switch between using a less aggressive shaping table and using a more aggressive shaping table, provides at least one of a gain adjustment and a phase adjustment when the switch is completed; and
  executes the ET mechanism by utilizing the selected shaping table to track the amplitude of the RF signal.

11. The transceiver module of claim 10, wherein the power amplifier controller:
  in response to the ET mechanism being activated and the resource block frequency allocation being at least equal to the threshold allocation value, disables a high frequency processing path of a corresponding power converter to provide enhanced noise performance; and in response to the APT mechanism being activated and the resource block frequency allocation being less than the threshold allocation value: enables the high frequency processing path of the corresponding power converter to provide enhanced power amplifier efficiency; disables an additional filtering previously added when the low frequency processing path is enabled and the high frequency processing path is disabled; and provides at least one of a gain adjustment and a phase adjustment when the ET mechanism is activated.

12. The transceiver module of claim 11, wherein the power amplifier controller disables the high frequency processing path by:

in response to the resource block frequency allocation being at least equal to the threshold allocation value, pre-charging an analog filter to a desired power converter output value, wherein the analog filter is capable of controlling a spurious output of a low frequency processing path of the corresponding power converter, wherein said pre-charging is initiated at a first time instant;

completing said pre-charging at a second time instant;

in response to the pre-charging being completed at the second time instant: initiating filtering on a low frequency path of the corresponding power converter using the analog filter; and disabling a high frequency processing path of the corresponding power converter;

in response to disabling a high frequency processing path of the corresponding power converter, provides one of a single fixed step power amplifier gain adjustment and multiple step power amplifier gain adjustments; and providing a phase adjustment concurrent with disabling the high frequency processing path of the corresponding power converter.

13. The transceiver module of claim 8, wherein the power amplifier controller:

provides a gradual signal change by using a pre-defined low rate of change from a first supply signal provided to the power amplifier to a second supply signal that is provided to the power amplifier; and controls power supply levels to prevent, during a transition from the first supply signal to the second supply signal, signal amplitudes from overshooting an amplitude range defined by the amplitude levels of the first and second voltage controlled supply signals by more than a threshold level, wherein said transition occurs within a predetermined time window substantially centered about a boundary between a pair of time slots within which signal transmissions are provided, wherein said pre-determined time window enables changes in modulation parameters and supply signals to be provided.

14. The transceiver module of claim 8, wherein:

the first configuration of the voltage controlled power converter is a first configuration of a first DCDC converter;

the second configuration of the voltage controlled power converter is one of (a) a second configuration of the first DCDC converter and (b) a second DCDC converter;

the ET mechanism utilizes the first DCDC converter;

the APT mechanism utilizes one of the first DCDC converter and the second DCDC converter; and in response to the ET mechanism and the APT mechanism both utilizing the first DCDC converter, the ET mechanism selectively utilizes a first set of components included within the first DCDC converter and the APT mechanism selectively utilizes a second set of components included within the first DCDC converter.

15. A wireless communication device having a transceiver module coupled to at least one antenna and which includes:

at least one processor;

at least one RF integrated circuit (RFIC);

a power amplifier;

an envelope tracking (ET) supply module;

an average power tracking (APT) supply module;

a power amplifier controller located within the at least one radio frequency integrated circuit (RFIC) and coupled to the ET supply module and to the APT supply module and which:

initiates an envelope tracking (ET) mechanism to track changes in amplitudes of a radio frequency (RF) signal being received by the power amplifier;

provides an instantaneous amplitude of the RF signal to a first configuration of a voltage controlled power converter from the ET mechanism;

determines a bandwidth of the radio frequency (RF) signal;

calculates an average amplitude of the RF signal;

in response to at least one of (a) the RF signal bandwidth being at least equal to a threshold bandwidth and (b) the average amplitude of the RF signal being less than a threshold value:

temporarily deactivates the ET mechanism;

activates an average power tracking (APT) mechanism to trigger a power supply to provide power using the average amplitude of the RF signal;

provides, to a second configuration of the voltage controlled power converter, an average amplitude of the RF signal; and provides to the power amplifier a power supply voltage having amplitude variations that are determined based on which tracking mechanism from among the ET mechanism and the APT mechanism is activated.

16. The wireless communication device of claim 15, wherein the power amplifier controller:

in response to a switch from the ET mechanism to the APT mechanism occurring: pre-charges at a first time instant an analog filter to a pre-established power converter output value; completes said pre-charging at a second time instant; and in response to the pre-charging being completed at the second time instant: initiates filtering on a low frequency processing path of the power converter using the analog filter; disables a high frequency processing path of the power converter; and provides at least one of a gain adjustment and a phase adjustment at a third time instant; and in response to a switch from the APT mechanism to the ET mechanism occurring: enables a high frequency processing path of the power converter; disables an additional filtering previously added when the low frequency processing path is enabled and the high frequency path is disabled; and provides at least one of a gain adjustment and a phase adjustment when the ET mechanism is activated.

17. The wireless communication device of claim 15, wherein the power amplifier controller:

determines a resource block frequency allocation of the RF signal;

in response to the ET mechanism being activated and the resource block frequency allocation of the RF signal being less than a threshold allocation value and lower than a low threshold value, selects an aggressive shaping table from among a collection of shaping tables which include shaping tables having different levels of aggressiveness, wherein each of said shaping tables respectively map an instantaneous RF envelope to an applied supply voltage;

in response to the ET mechanism being activated and the resource block frequency allocation being less than the threshold allocation value and higher than the low threshold value, selects a less aggressive shaping table;

in response to initiating a switch between using a less aggressive shaping table and using a more aggressive shaping table, provides at least one of a gain adjustment and a phase adjustment when the switch is completed; and executes the ET mechanism by utilizing the selected shaping table to track the amplitude of the RF signal.

18. The wireless communication device of claim 17, wherein the power amplifier controller:

in response to the ET mechanism being activated and the resource block frequency allocation being at least equal to the threshold allocation value, disables a high frequency processing path of a corresponding power converter to provide enhanced noise performance, wherein the power amplifier controller disables the high frequency processing path by:

in response to the resource block frequency allocation being at least equal to the threshold allocation value, pre-charging at a first time instant an analog filter to a desired power converter output value;

completing said pre-charging at a second time instant;

in response to the pre-charging being completed at the second time instant: initiating filtering on a low frequency path of the corresponding power converter using the analog filter; and disabling a high frequency processing path of the corresponding power converter;

in response to disabling a high frequency processing path of the corresponding power converter, provides one of a single fixed step power amplifier gain adjustment and multiple step power amplifier gain adjustments; and provides a phase adjustment concurrent with disabling the high frequency processing path of the corresponding power converter; and in response to the APT mechanism being activated and the resource block frequency allocation being less than the threshold allocation value: enables the high frequency processing path of the corresponding power converter to provide enhanced power amplifier efficiency; disables an additional filtering previously added when the low frequency processing path is enabled and the high frequency path is disabled; and provides at least one of a gain adjustment and a phase adjustment when the ET mechanism is activated.

19. The wireless communication device of claim 15, wherein the power amplifier controller:

provides a gradual signal change by using a pre-defined low phase rate of change from a first supply signal provided to the power amplifier to a second supply signal that is provided to the power amplifier; and controls power supply levels to prevent, during a transition from the first supply signal to the second supply signal, signal amplitudes from overshooting an amplitude range defined by the amplitude levels of the first and second voltage controlled supply signals by more than a threshold level, wherein said transition occurs within a pre-determined time window substantially centered about a boundary between a pair of time slots within which signal transmissions are provided, wherein said pre-determined time window enables changes in modulation parameters and supply signals to be provided.

20. The wireless communication device of claim 15, wherein:

the first configuration of the voltage controlled power converter is a first configuration of a first DCDC converter;

the second configuration of the voltage controlled power converter is one of (a) a second configuration of the first DCDC converter and (b) a second DCDC converter;

the ET mechanism utilizes the first DCDC converter;

the APT mechanism utilizes one of the first DCDC converter and the second DCDC converter; and in response to the ET mechanism and the APT mechanism both utilizing the first DCDC converter, the ET mechanism selectively utilizes a first set of components included within the first DCDC converter and the APT mechanism selectively utilizes a second set of components included within the first DCDC converter.

* * * * *